United States Patent
Vopat et al.

(10) Patent No.: US 11,985,756 B2
(45) Date of Patent: May 14, 2024

(54) LINEAR ACCELERATOR COIL INCLUDING MULTIPLE FLUID CHANNELS

(71) Applicant: Applied Materials, Inc., Santa Clara, CA (US)

(72) Inventors: Robert B. Vopat, Austin, TX (US); Charles T. Carlson, Cedar Park, TX (US)

(73) Assignee: Applied Materials, Inc., Santa Clara, CA (US)

( * ) Notice: Subject to any disclaimer, the term of this patent is extended or adjusted under 35 U.S.C. 154(b) by 121 days.

(21) Appl. No.: 17/505,977

(22) Filed: Oct. 20, 2021

(65) Prior Publication Data
US 2023/0119010 A1  Apr. 20, 2023

(51) Int. Cl.
*H05H 7/22* (2006.01)
*H01J 37/317* (2006.01)
*H05H 9/00* (2006.01)

(52) U.S. Cl.
CPC ........... *H05H 7/22* (2013.01); *H01J 37/3171* (2013.01); *H05H 9/00* (2013.01); *H01J 2237/0473* (2013.01); *H01J 2237/141* (2013.01); *H01J 2237/31701* (2013.01)

(58) Field of Classification Search
None
See application file for complete search history.

(56) References Cited

U.S. PATENT DOCUMENTS

| | | | | |
|---|---|---|---|---|
| 2,860,279 A | * | 11/1958 | Hester | H05H 9/00 315/5.46 |
| 2,939,036 A | * | 5/1960 | Nelson | H01J 25/12 333/248 |
| 2,963,616 A | * | 12/1960 | Symons | H01J 23/207 315/39 |
| 2,971,115 A | * | 2/1961 | Nelson | H01P 7/06 315/5 |
| 3,133,227 A | * | 5/1964 | Nunan | H05H 9/00 315/5.46 |
| 3,169,206 A | * | 2/1965 | Nelson | H01J 23/20 313/313 |

(Continued)

FOREIGN PATENT DOCUMENTS

| | | |
|---|---|---|
| EP | 0996316 A1 | 4/2000 |
| EP | 1014763 A2 | 6/2000 |

(Continued)

OTHER PUBLICATIONS

International Search Report and Written Opinion for the International Application No. PCT/US2022/044854 dated Jan. 17, 2023, 7 pages.

*Primary Examiner* — Srinivas Sathiraju
(74) *Attorney, Agent, or Firm* — KDW Firm PLLC (57) ABSTRACT

Embodiments herein are directed to a linear accelerator assembly for an ion implanter, wherein the linear accelerator includes a jacketed resonator coil. In some embodiments, a linear accelerator assembly may include a first fluid conduit and a coil resonator coupled to the first fluid conduit, wherein the coil resonator is operable to receive a first fluid via the first fluid conduit, wherein the coil resonator comprises a first coil conduit adjacent a second coil conduit, and wherein a first fluid channel defined by the first coil conduit is operable to receive the first fluid.

19 Claims, 5 Drawing Sheets

(56) References Cited

U.S. PATENT DOCUMENTS

| | | | | |
|---|---|---|---|---|
| 3,993,910 A * | 11/1976 | Parkin | ............... | H05H 6/00 |
| | | | | 376/199 |
| 5,506,472 A | 4/1996 | Ito | | |
| 6,208,095 B1 * | 3/2001 | DiVergilio | ............... | H05H 7/18 |
| | | | | 315/505 |
| 6,239,541 B1 * | 5/2001 | Fujisawa | ............... | H05H 7/04 |
| | | | | 315/505 |
| 6,423,976 B1 * | 7/2002 | Glavish | ............... | H01J 37/3171 |
| | | | | 315/505 |
| 7,183,514 B2 * | 2/2007 | Kamarehi | ............... | H01J 37/32192 |
| | | | | 219/121.48 |
| 7,768,765 B2 * | 8/2010 | Nguyen | ............... | H01L 21/67109 |
| | | | | 361/230 |
| 7,820,981 B2 * | 10/2010 | Horsky | ............... | H01J 9/38 |
| | | | | 315/111.21 |
| 8,044,374 B2 * | 10/2011 | Ryding | ............... | H01J 37/08 |
| | | | | 250/397 |
| 8,084,965 B2 * | 12/2011 | Takayama | ............... | H05H 15/00 |
| | | | | 315/504 |
| 8,279,577 B2 * | 10/2012 | Nguyen | ............... | H01L 21/6875 |
| | | | | 361/230 |
| 8,963,075 B2 * | 2/2015 | Chen | ............... | H01J 49/4265 |
| | | | | 250/288 |
| 9,779,905 B2 * | 10/2017 | Kumakhov | ............... | G21K 1/02 |
| 9,913,360 B1 * | 3/2018 | Antipov | ............... | H05H 7/02 |
| 10,763,071 B2 * | 9/2020 | Sinclair | ............... | H05H 9/00 |
| 11,094,504 B2 * | 8/2021 | Biloiu | ............... | H01J 23/18 |
| 11,596,051 B2 * | 2/2023 | Biloiu | ............... | H05H 7/22 |
| 2004/0061068 A1 * | 4/2004 | Farley | ............... | H01J 27/08 |
| | | | | 250/427 |
| 2010/0213851 A1 | 8/2010 | Chang Diaz | | |
| 2014/0098919 A1 * | 4/2014 | Kumakhov | ............... | H05H 7/04 |
| | | | | 376/199 |
| 2014/0217893 A1 * | 8/2014 | Chang Diaz | ............... | H05H 1/54 |
| | | | | 315/111.31 |
| 2016/0205759 A1 * | 7/2016 | Chang Diaz | ............... | H05H 1/46 |
| | | | | 315/111.41 |
| 2019/0371562 A1 * | 12/2019 | Sinclair | ............... | H01J 37/05 |
| 2021/0210307 A1 * | 7/2021 | Biloiu | ............... | H01J 37/3007 |
| 2022/0183137 A1 * | 6/2022 | Sinclair | ............... | H05H 9/042 |
| 2022/0307997 A1 * | 9/2022 | Meijer | ............... | C09K 11/65 |
| 2023/0089170 A1 * | 3/2023 | Carlson | ............... | H05H 9/00 |
| | | | | 315/505 |
| 2023/0119010 A1 * | 4/2023 | Vopat | ............... | H05H 7/22 |
| | | | | 250/492.3 |

FOREIGN PATENT DOCUMENTS

| | | | | |
|---|---|---|---|---|
| EP | | 1056113 A2 | 11/2000 | |
| TW | | 512651 B | 12/2002 | |
| WO | WO-2023043567 A1 * | | 3/2023 | ............... H05H 7/22 |

* cited by examiner

LINEAR ACCELERATOR COIL INCLUDING MULTIPLE FLUID CHANNELS

FIELD OF THE DISCLOSURE

The present disclosure relates generally to high-energy ion implanters and, more particularly, to linear accelerators with multiple fluid channels to regulate both coil temperature and coil pressure.

BACKGROUND OF THE DISCLOSURE

Ion implantation is a process of introducing dopants or impurities into a substrate via bombardment. Ion implantation systems include an ion source and a series of beam-line components. The ion source may comprise a chamber where ions are generated. The ion source may also include a power source and an extraction electrode assembly disposed near the chamber. The beam-line components may include, for example, a mass analyzer, a first acceleration or deceleration stage, a collimator, and a second acceleration or deceleration stage. Much like a series of optical lenses for manipulating a light beam, the beam-line components can filter, focus, and manipulate ions or an ion beam having particular species, shape, energy, and/or other qualities. The ion beam passes through the beam-line components and may be directed toward a substrate mounted on a platen or clamp.

Implantation apparatuses capable of generating ion energies of approximately 1 MeV or greater are often referred to as high-energy ion implanters, or high-energy ion implantation systems. One type of high-energy ion implanter is a linear accelerator (LINAC) in which a series of electrodes arranged as tubes conduct and accelerate the ion beam to increasingly higher energy along the succession of tubes, where the electrodes receive an AC voltage signal. Standard LINACs are driven by, e.g., a 10-20 MHz signal using a resonator circuit including a coil and a capacitor. In some cases, the coil is subjected to a large electrical power load, which leads to varied inductance and capacitance due to thermal expansion.

What is therefore needed is a LINAC with a more controllable coil shape.

SUMMARY OF THE DISCLOSURE

This Summary is provided to introduce a selection of concepts in a simplified form further described below in the Detailed Description. This Summary is not intended to identify key features or essential features of the claimed subject matter, nor is the Summary intended as an aid in determining the scope of the claimed subject matter.

In one approach, a linear accelerator assembly may include a first fluid conduit and a coil resonator coupled to the first fluid conduit, wherein the coil resonator is operable to receive a first fluid via the first fluid conduit, wherein the coil resonator comprises a first coil conduit adjacent a second coil conduit, and wherein a first fluid channel defined by the first coil conduit is operable to receive the first fluid.

In another approach, a coil resonator of a linear accelerator may include a first coil conduit operable to receive a first fluid, and a second coil conduit positioned within the first coil conduit, wherein the second coil conduit is operable to receive a second fluid.

In yet another approach, a coil resonator of a linear accelerator may include a first coil conduit defining a first fluid channel operable to deliver a first fluid, and a second coil conduit positioned within an interior channel of the first coil conduit, wherein a second fluid channel of the second coil conduit is operable to deliver a second fluid. The coil resonator may further include a third coil conduit positioned within the second coil conduit, wherein a third fluid channel of the third coil conduit is in fluid communication with the second fluid channel.

In still yet another approach, an ion implanter may include an ion source operable to generate an ion beam, and a linear accelerator assembly operable to receive the ion beam from the ion source. The linear accelerator assembly may include a first fluid conduit, and a coil resonator coupled to the first fluid conduit, wherein the coil resonator is operable to receive a first fluid via the first fluid conduit, wherein the coil resonator comprises a first coil conduit adjacent a second coil conduit, and wherein a first fluid channel defined by the first coil conduit is operable to receive the first fluid.

BRIEF DESCRIPTION OF THE DRAWINGS

The accompanying drawings illustrate exemplary approaches of the disclosure, including the practical application of the principles thereof, as follows.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Ion implanters and linear accelerators in accordance with the present disclosure will now be described more fully hereinafter with reference to the accompanying drawings, where embodiments of the ion implanters and linear accelerators are shown. The ion implanters and linear accelerators may be embodied in many different forms and are not to be construed as being limited to the embodiments set forth herein. Instead, these embodiments are provided so this disclosure will be thorough and complete, and will fully convey the scope of the disclosure to those skilled in the art.

Provided herein is an improved high-energy ion implantation system, which may also be referred to herein as an "ion implanter" for the sake of brevity. Various embodiments provide novel configurations for generating high-energy ions, where the final ion energy delivered to a substrate may be 1 MeV or greater. One aspect of embodiments of the present disclosure is a novel LINAC assembly, providing various advantages over known beamline architectures, including a jacketed resonator coil of the LINAC.

As noted above, coil shape influences resonant frequency. Once a coil shape is tuned for a given frequency, any influences on total system capacitance and/or inductance will alter the resonant frequency. Operation at a fixed frequency requires either the system capacitance and/or system inductance to be modifiable during operation due to thermal expansion. In prior art approaches, an external capacitor plate may be used to adjust system capacitance. That is, mounted arms or clamps are used to stretch or compress the coil either statically or dynamically to affect inductance. However, high RF and voltage exists on the coil surface, which causes any external arm or clamp to cause RF heating and arching. Furthermore, the capacitor plate acts as a parasitic energy sink at all times.

Embodiments of the present disclosure overcome the deficiencies of the prior art by using internal fluid pressure changes to modify the coil shape and therefore the inductance, self-capacitance, and resonate frequency of the system. Advantageously, fluid internal to the coil is not influenced by RF, as the fluid is fully contained within a grounded vessel. In some embodiments, the coil may include a first coil conduit defining a first fluid channel operable to deliver a first fluid, and a second coil conduit positioned within an interior channel of the first coil conduit, wherein a second fluid channel of the second coil conduit is operable to deliver a second fluid. The coil may further include a third coil conduit positioned within the second coil conduit, wherein a third fluid channel of the third coil conduit is in fluid communication with the second fluid channel to transport the second fluid.

Figure 1:
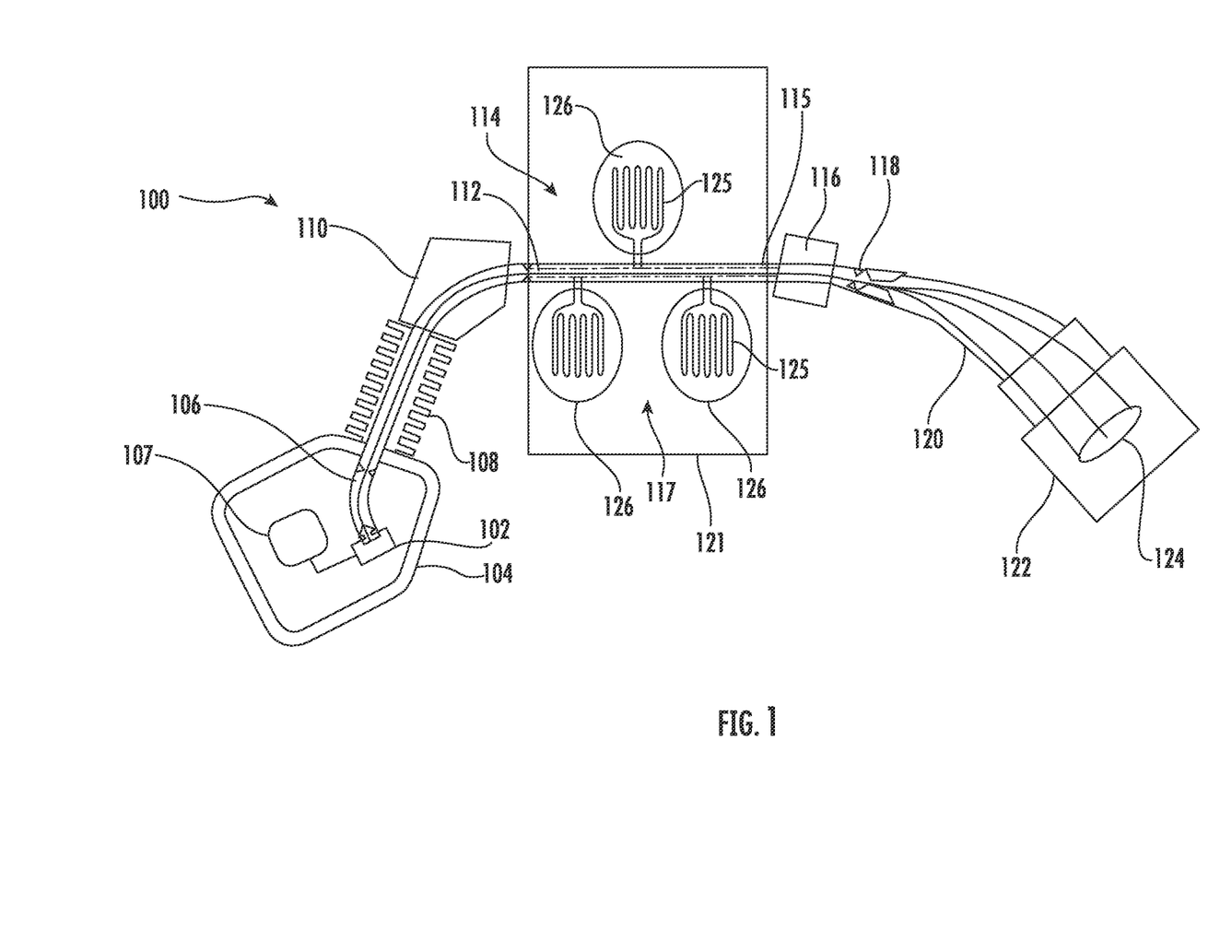
FIG. 1 is a schematic view illustrating an ion implanter, in accordance with embodiments of the present disclosure.

Referring now to FIG. 1, an exemplary ion implanter (hereinafter "implanter") 100 is shown in block form. The implanter 100 may represent a beamline ion implanter, with some elements not shown for clarity of explanation. The implanter 100 may include an ion source 102 and a gas box 107 disposed in a terminal 104. The ion source 102 may include an extraction system including extraction components and filters (not shown) to generate an ion beam 106 at a first energy. Although non-limiting, the first energy may range from 5 keV to 100 keV. The implanter 100 may further include a DC accelerator column 108, disposed downstream of the ion source 102. The DC accelerator column 108 is operable to accelerate the ion beam 106 to a second ion energy, where the second ion energy is greater than the first ion energy.

The implanter 100 may further include an analyzer 110, operable to analyze the accelerated ion beam 106, for example, by changing the trajectory of the ion beam 106. The implanter 100 may also include a buncher 112 and a linear accelerator assembly 114 within a chamber 117 (e.g., vacuum chamber) of a housing 121, the linear accelerator assembly 114 disposed downstream of the DC accelerator column 108. During use, the linear accelerator assembly 114 is operable to accelerate the ion beam 106 to a third energy, greater than the second energy.

The linear accelerator assembly 114 may include a plurality of accelerator stages 126, each including one or more resonant coils 125, as will be further described herein. In some embodiments, the accelerator stages 126 of the linear accelerator assembly 114 may be double gap accelerator stages, while in other embodiments the accelerator stages 126 may be triple gap accelerator stages. In particular embodiments, the linear accelerator assembly 114 may include at least three triple gap accelerator stages. Embodiments are not limited in this context, however. In various embodiments, the implanter 100 may include additional components, such as filter magnet 116, a scanner 118, and a collimator 120, which together deliver the ion beam 106 to an end station 122 for processing a substrate 124. As shown, the filter magnet 116, the scanner 118, and the collimator 120 are positioned downstream of the linear accelerator assembly 114.

Figure 2:
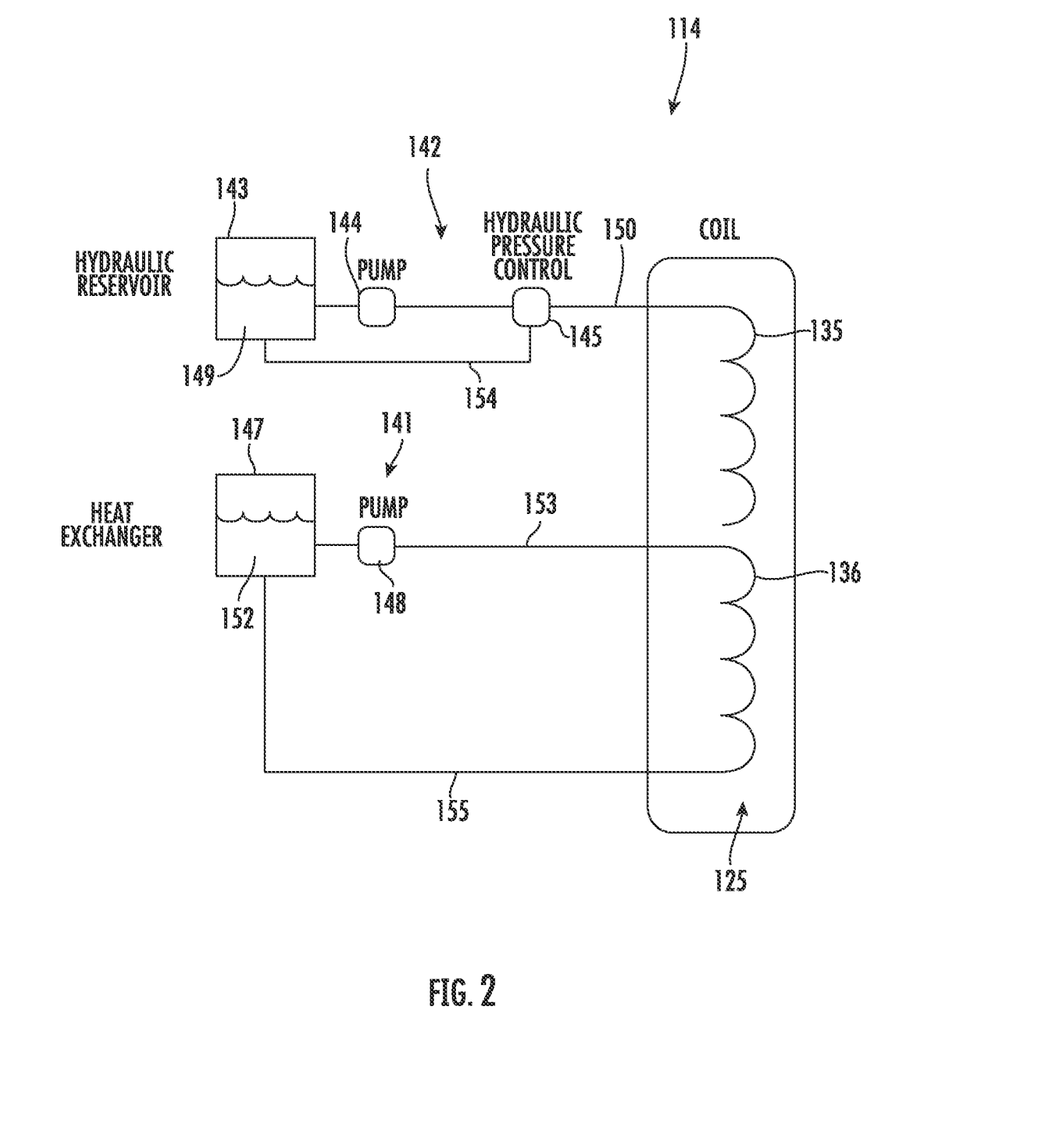
FIG. 2 is a schematic view illustrating a LINAC accelerator assembly of the ion implanter, in accordance with embodiments of the present disclosure

FIG. 2 demonstrates an example linear accelerator assembly 114 according to embodiments of the present disclosure. As shown, the linear accelerator assembly 114 may include the coil 125, which may be a coil of an RF coil resonator. The coil 125 may include a first coil conduit 135 adjacent a second coil conduit 136. As will be described in greater detail herein, within the second coil conduit 136 may be a third coil conduit (not shown). The first coil conduit 135 may operate with a pressure shaping system 142, while the second coil conduit 136 may operate with a cooling system 141. In some embodiments, the pressure shaping system 142 may include a hydraulic reservoir 143, a first pump 144, and pressure control device 145. Although non-limiting, the pressure control device 145 may be a pressure-sensitive, directional control valve (e.g., one-way or two-way). The cooling system 141 may further include a heat exchanger 147 coupled to a second pump 148.

During use, a first fluid 149 from the hydraulic reservoir 143 may be delivered to and from the first coil conduit 135 via a first fluid conduit 150 to adjust a pressure within the coil 125. In some embodiments, the first pump 144 may receive instructions from a controller or processor (not shown) to begin drawing the first fluid 149 from the hydraulic reservoir 143 at a selected pressure and flow rate. The pressure control device 145 may allow flow of the first fluid 149 into the first coil conduit 135. As the first coil conduit 135 continues to fill, pressure builds within the first coil conduit 135, which may cause a shape of the coil 125 to change. Once the pressure within the first coil conduit 135 exceeds a predetermined threshold, the pressure control device 145 may again open, which causes the first fluid 149 to travel from the first coil conduit 135 back towards the hydraulic reservoir 143. As shown, the pressure shaping system 142 may include a first return conduit 154 for transporting the first fluid 149 to the hydraulic reservoir 143.

A second fluid 152 from the heat exchanger 147 may be delivered to the second coil conduit 136 via a second fluid conduit 153 to provide cooling to the coil 125. After passing through the second coil conduit 136 and/or the third coil conduit, the second fluid 152 may be returned to the heat exchanger 147 via a second return conduit 155. Although non-limiting, the first and second fluids 149, 152 may be water. In other embodiments, the second fluid 152 may be a water-glycol solution, steam, or a refrigerant. The first and second fluids 149, 152 may be the same or different in various embodiments.

Figure 3:
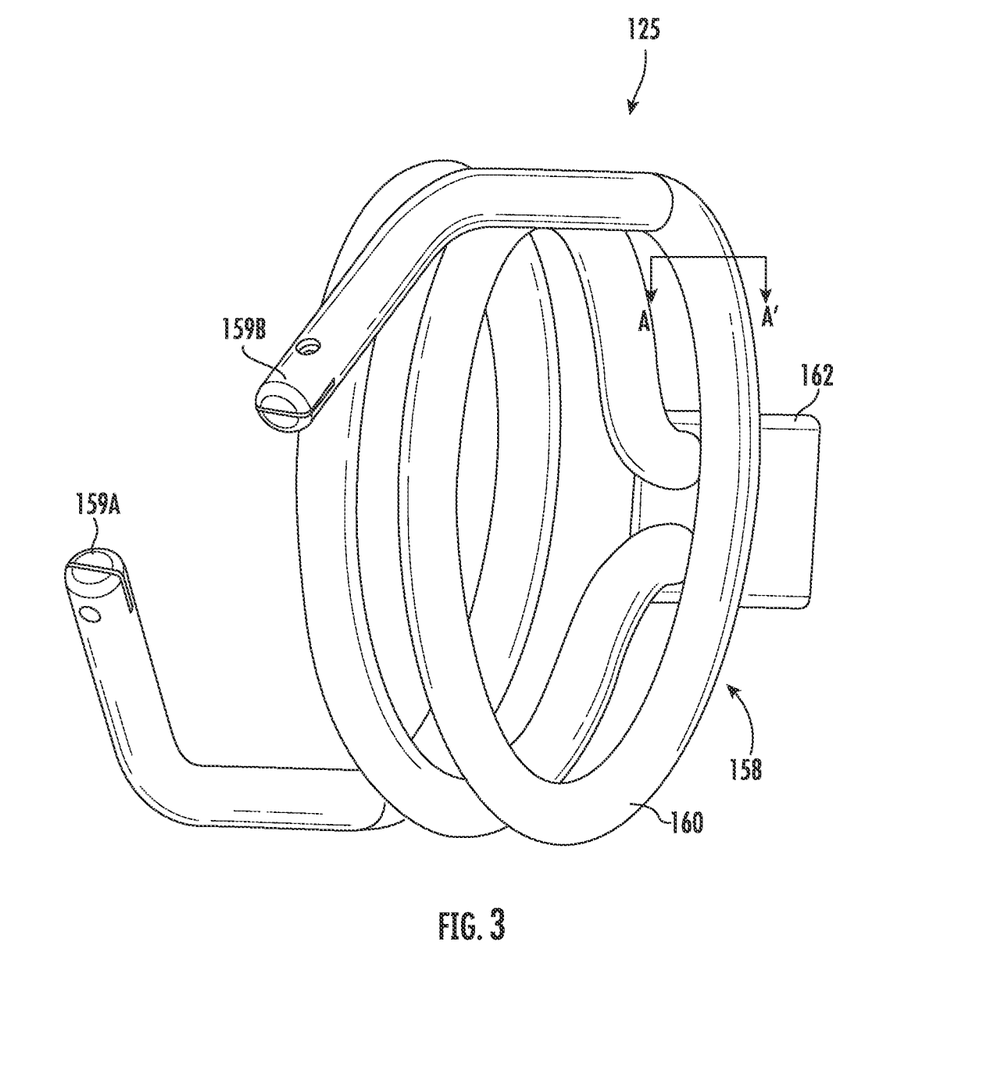
FIG. 3 is a perspective view of a resonator coil of the LINAC accelerator assembly, in accordance with embodiments of the present disclosure.

Turning now to FIG. 3, the coil 125 of the linear accelerator assembly will be described in greater detail. As shown, the coil 125 may include a central section 158 extending to a set of free ends 159A, 159B. Electrodes (not shown) may be coupled to each of the free ends 159A, 159B to allow passage of the ion beam 106 therethrough. At an opposite end, the central section 158 may be coupled to a chambered manifold block 162, which provides both mechanical support and fluid distribution through the coil 125. Although not shown, the manifold block 162 may include a plurality of pathways to direct the first fluid 149 and the second fluid 152 to and from the coil 125.

The central section 158 of the coil 125 may include a plurality of segments or loops 160 extending helically about a central axis. Although non-limiting, the central axis may generally extend perpendicular to a beamline axis, which extends through the electrodes. In some embodiments, each of the first coil conduit 135, the second coil conduit 136, and the third coil conduit may have a substantially circular cross-sectional profile. In other embodiments, one or more of the first coil conduit 135, the second coil conduit 136, and the third coil conduit may have an asymmetrical cross-sectional profile. For example, one or more of the first coil conduit 135, the second coil conduit 136, and the third coil conduit may have a flattened portion or surface.

Figure 4:
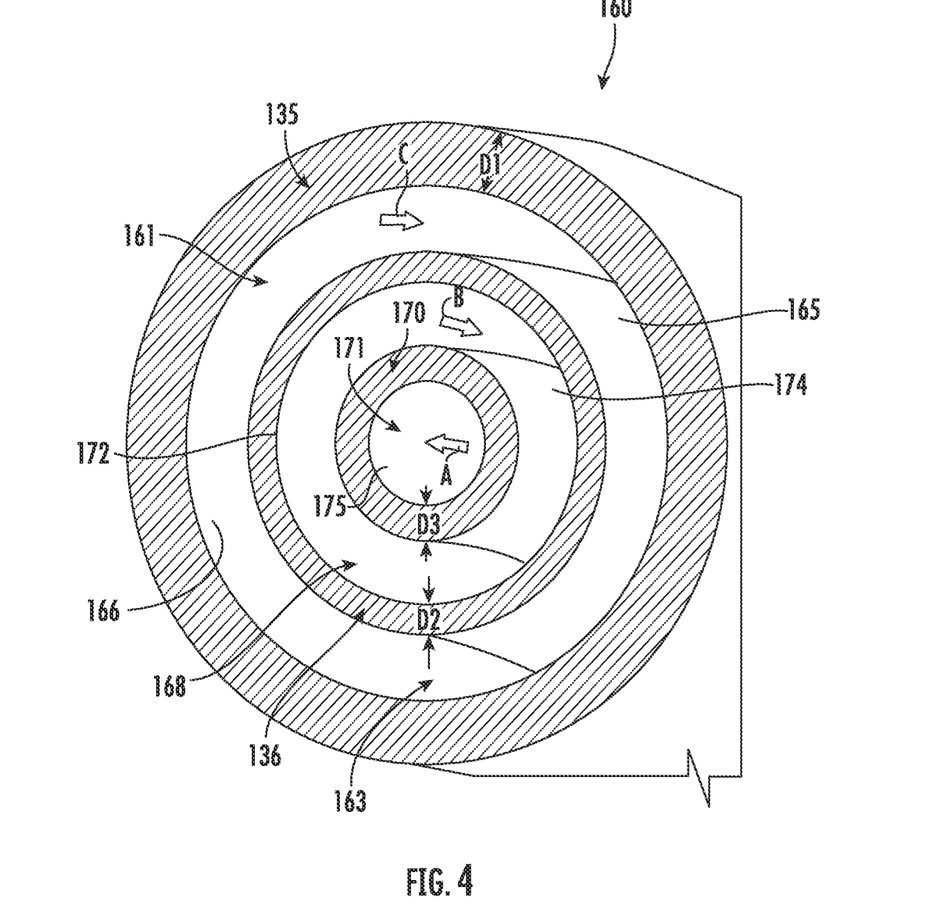
FIG. 4 is a cross-sectional view of the resonator coil of the LINAC accelerator assembly along cutline A-A' in FIG. 3, in accordance with embodiments of the present disclosure.

As shown in the cross-sectional view of FIG. 4, each loop 160 of the coil 125 may include the first coil conduit 135 defining a first fluid channel 161 operable to transport the first fluid 149 therein. The second coil conduit 136 may be positioned within an interior channel 163 of the first coil conduit 135, the second coil conduit 136 defining a second fluid channel 168 operable to transport the second fluid 152 therein. The third coil conduit 170 may be positioned within the second coil conduit 136, the third coil conduit 170 defining a third fluid channel 171 therein. In some embodiments, the first coil conduit 135, the second coil conduit 136, and the third coil conduit 170 may be concentrically positioned with respect to one another. Embodiments herein are not limited in this respect, however. For example, the second and/or the third coil conduits 136, 170 may be positioned off-center with respect to a first coil central axis of the first coil conduit 135. Similarly, the third coil conduit 170 may be positioned off-center with respect to the first coil central axis of the first coil conduit 135 and/or a second coil central axis of the second coil conduit 136. In yet other embodiments, some portions of the second and/or the third coil conduits 136, 170 may be concentrically positioned with respect to one another, while other portions of the second and/or third coil conduits 136, 170 may be nonconcentric with respect to one another.

In various embodiments, the second and third coil conduits 136, 170 may be made from copper, while the first coil conduit 135 may also be made from copper or any other material suitable for the environment. The material of the second conduit 136 may be selected to have a relatively high heat transfer with the first fluid channel 161. In some embodiments, the first coil conduit 135 may be electrically conductive, or super conductive, on the out 5 skin depths based on the RF frequency. For example, around 100 um will handle most frequencies. Below 5 RF skin depths the material only needs to be thermally conductive and be able to handle the pressure environment. In some cases, aluminum or copper with a silver coating may be used.

An exterior surface 165 of the second coil conduit 136 and an interior surface 166 of the first coil conduit 135 may define the first fluid channel 161. An interior surface 172 of the second coil conduit 136 and an exterior surface 174 of the third coil conduit 170 may define the second fluid channel 168. An interior surface 175 of the third coil conduit 170 may define the third fluid channel 171. The second fluid channel 168 and the third fluid channel 171 may be fluidly connected with one another. To cool the coil 125 during use, the second fluid 152 may be delivered through the third fluid channel 171 in a direction shown by arrow 'A' and returned through the second fluid channel 168 in a direction shown by arrow 'B'. It will be appreciated that the flow direction may be reversed in other embodiments. Meanwhile, the first fluid 149 may be delivered in a direction shown by arrow 'C'. Advantageously, the second coil conduit 136 decouples, or separates, the first fluid 149 from the second fluid 152.

As further shown, a first radial distance 'D1' between an exterior surface 177 and the interior surface 166 of the first coil conduit 135 may define a first wall thickness, while a second radial distance 'D2' between the exterior surface 165 and the interior surface 172 of the second coil conduit 136 may define a second wall thickness. Similarly, a third radial distance 'D3' between the exterior surface 174 and the interior surface 175 of the third coil conduit 170 may define a third wall thickness. In some embodiments, D1 is greater than D2 and D3. By making D1 greater than D2 and/or D3, the first coil conduit 135 acts like a jacket. In various embodiments, D2 is the same or different than D3.

Figure 5:
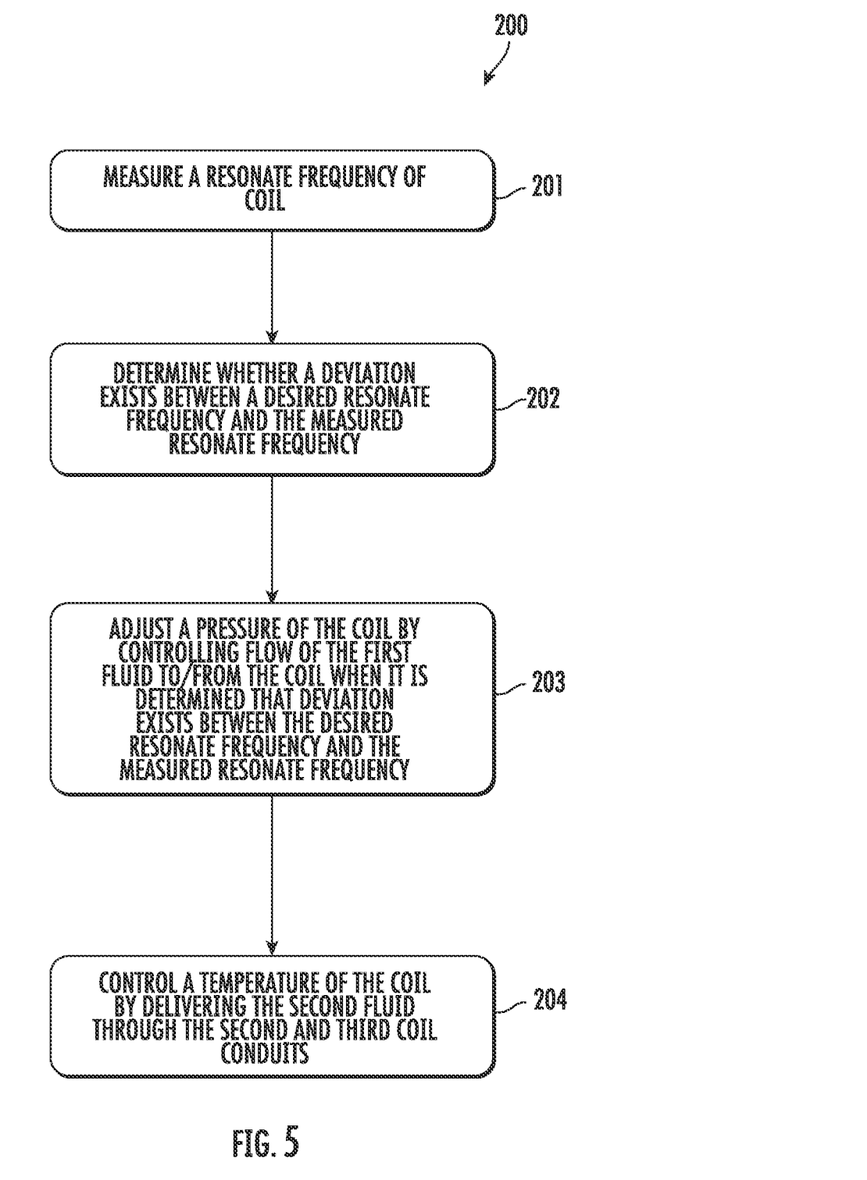
FIG. 5 is a flowchart depicting a process for operating the LINAC accelerator assembly in accordance with embodiments of the present disclosure.

Turning now to FIG. 5, a non-limiting method 200 for adjusting pressure within the coil 125 will be described. The method 200 will be described in conjunction with the linear accelerator assembly 114 and the coil 125 described herein. At block 201, the method 200 may include measuring a resonate frequency of the coil 125. In some embodiments, any number of sensing devices may be used to determine capacitance and inductance of the coil. In some embodiments, a controller or processor may receive data from the sensing device(s) and determine the resonate frequency of the coil 125. Measurements may be automatically taken at regular intervals, upon the occurrence of an event, or in response to an operator request.

At block 202, the method 200 may include determining whether a deviation exists between a desired resonate frequency of the coil 125 and the measured resonate frequency. In some embodiments, the controller/processor makes this determination.

At block 203, the method 200 may include adjusting a pressure of the coil 125 by controlling flow of the first fluid 149 to/from the coil 125 when it is determined that a deviation between the desired resonate frequency and the measured resonate frequency exceeds a predetermined threshold. In some embodiments, to increase pressure within the coil, the method may include activating the first pump 144 to begin drawing a fluid (e.g., water) from the hydraulic reservoir 143. The first fluid 149 may be delivered into the first coil conduit 135 via the first fluid conduit 150. In other embodiments, to decrease pressure, the method may include opening the pressure control device 145 and withdrawing the first fluid 149 from the first coil conduit 135 and then through the first return conduit 154. In some embodiments, the first pump 144 may be used to remove the first fluid 149 from the first coil conduit 135. For example, the first pump 144 may be a two-way or dual action pump. In other embodiments, multiple pumps may be present within the pressure shaping system 142 to control flow of the first fluid 149 in both directions.

At block 204, the method 200 may include controlling a temperature of the coil 125 by delivering the second fluid 152 through the second and third coil conduits 136, 170. In some embodiments, one or more temperature sensing devices may be present for determining a temperature of the coil 125. The temperature information may be relayed to the controller/processor, which in turn is operable to instruct the heat exchanger 147 to increase or decrease the temperature of the second fluid 152 at the heat exchanger 147. It will be appreciated that the process of measuring and controlling the temperature of the coil 125 may be periodically performed. Said another way, the temperature of the coil 125 may be measured and controlled before and/or after the pressure is adjusted in the coil 125. Because temperature, inductance, and capacitance are dynamic as the linear accelerator assembly 114 is being operated, the temperature and the pressure of the coil 125 may be constantly monitored and adjusted as desired to maintain a consistent resonant transformer frequency. Advantageously, these adjustments can be made under vacuum potential.

Embodiments of the present disclosure provide numerous technical benefits and advantages including, but not limited to, no parasitic losses and thus less RF power being needed, no RF heating, no insulator failure points (e.g., at mechanical connection points), easy control and fast response, reduction in initial coil setup time and skill required, allowance of dynamic inductance/capacitance changes with RF and vacuum active, and expansion of the ability to operate the implanter with other dynamic capacitance and inductance loads.

The foregoing discussion has been presented for purposes of illustration and description and is not intended to limit the disclosure to the form or forms disclosed herein. For example, various features of the disclosure may be grouped together in one or more aspects, embodiments, or configurations for the purpose of streamlining the disclosure. However, it should be understood that various features of the certain aspects, embodiments, or configurations of the disclosure may be combined in alternate aspects, embodiments, or configurations.

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

The use of "including," "comprising," or "having" and variations thereof herein is meant to encompass the items listed thereafter and equivalents thereof as well as additional items. Accordingly, the terms "including," "comprising," or "having" and variations thereof are open-ended expressions and can be used interchangeably herein.

All directional references (e.g., proximal, distal, upper, lower, upward, downward, left, right, lateral, longitudinal, front, back, top, bottom, above, below, vertical, horizontal, radial, axial, clockwise, and counterclockwise) are only used for identification purposes to aid the reader's understanding of the present disclosure, and do not create limitations, particularly as to the position, orientation, or use of this disclosure. Connection references (e.g., attached, coupled, connected, and joined) are to be construed broadly and may include intermediate members between a collection of elements and relative movement between elements unless otherwise indicated. As such, connection references do not necessarily infer that two elements are directly connected and in fixed relation to each other. Furthermore, identification references (e.g., primary, secondary, first, second, third, fourth, etc.) are not intended to connote importance or priority, but are used to distinguish one feature from another.

Although the illustrative method 200 is described as a series of acts or events, the present disclosure is not limited by the illustrated ordering of such acts or events unless specifically stated. For example, some acts may occur in different orders and/or concurrently with other acts or events apart from those illustrated and/or described herein, in accordance with the disclosure. In addition, not all illustrated acts or events may be necessary to implement a methodology in accordance with the present disclosure.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A linear accelerator assembly, comprising:
a first fluid conduit; and
a coil resonator coupled to the first fluid conduit, wherein the coil resonator is operable to receive a first fluid via the first fluid conduit, wherein the coil resonator comprises a first coil conduit adjacent a second coil conduit, wherein the second coil conduit extends through an interior channel of the first coil conduit, wherein a first fluid channel defined by the first coil conduit is operable to receive the first fluid, and wherein a second fluid channel defined by the second coil conduit is operable to receive a second fluid.

2. The linear accelerator assembly of claim 1, further comprising a third coil conduit, wherein the third coil conduit defines a third fluid channel operable to communicate the second fluid between the second fluid channel and the third fluid channel.

3. The linear accelerator assembly of claim 2, wherein the third coil conduit extends through the interior channel of the first coil conduit.

4. The linear accelerator assembly of claim 2, wherein the second fluid conduit is operable to deliver the second fluid to the second fluid channel or the third fluid channel.

5. The linear accelerator assembly of claim 4, further comprising a second pump coupled to the second fluid conduit to control flow of the second fluid between the coil resonator and a heat exchanger.

6. The linear accelerator assembly of claim 2, further comprising a first pumping device and a pressure control device coupled to the first fluid conduit to control flow of the first fluid.

7. The linear accelerator assembly of claim 2, wherein the first coil conduit, the second coil conduit, and the third coil conduit are concentrically positioned with respect to one another.

8. The linear accelerator assembly of claim 1, wherein the first fluid channel is defined by an interior surface of the first coil conduit and an exterior surface of the second coil conduit, wherein the second fluid channel is defined by an interior surface of the second coil conduit.

9. A coil resonator of a linear accelerator, the coil resonator comprising:
a first coil conduit defining a first fluid channel operable to receive a first fluid; and
a second coil conduit extending within an interior channel of the first coil conduit, wherein the second coil conduit defines a second fluid channel operable to receive a second fluid.

10. The coil resonator of claim 9, further comprising a third coil conduit, wherein the third coil conduit defines a third fluid channel operable to communicate the second fluid between the second fluid channel and the third fluid channel.

11. The coil resonator of claim 10, wherein the third coil conduit is positioned within the second coil conduit.

12. The coil resonator of claim 9, wherein the first fluid channel is defined by an interior surface of the first coil conduit and an exterior surface of the second coil conduit, and wherein the second fluid channel is defined by an interior surface of the second coil conduit.

13. The coil resonator of claim 10, wherein the first coil conduit, the second coil conduit, and the third coil conduit are concentrically positioned with respect to one another.

14. A coil resonator of a linear accelerator, the coil resonator comprising:
   a first coil conduit defining a first fluid channel operable to deliver a first fluid;
   a second coil conduit positioned within an interior channel of the first coil conduit, wherein a second fluid channel of the second coil conduit is operable to deliver a second fluid; and
   a third coil conduit positioned within the second coil conduit, wherein a third fluid channel of the third coil conduit is in fluid communication with the second fluid channel.

15. The coil resonator of claim 14, wherein the first fluid channel is defined by an interior surface of the first coil conduit and an exterior surface of the second coil conduit, wherein the second fluid channel is defined by an interior surface of the second coil conduit and an exterior surface of the third coil conduit, and wherein the third fluid channel is defined by an interior surface of the third coil conduit.

16. The coil resonator of claim 15, wherein a first radial distance between an exterior surface and the interior surface of the first coil conduit defines a first wall thickness, wherein a second radial distance between the exterior surface and the interior surface of the second coil conduit defines a second wall thickness, and wherein the first wall thickness is greater than the second wall thickness.

17. The coil resonator of claim 16, wherein a third radial distance between the exterior surface and the interior surface of the third coil conduit defines a third wall thickness, and wherein the first wall thickness is greater than the third wall thickness.

18. The coil resonator of claim 14, wherein the second coil conduit separates the first fluid from the second fluid.

19. An ion implanter, comprising:
   an ion source operable to generate an ion beam; and
   a linear accelerator assembly operable to receive the ion beam from the ion source, the linear accelerator assembly comprising:
      a first fluid conduit; and
      a coil resonator coupled to the first fluid conduit, wherein the coil resonator is operable to receive a first fluid via the first fluid conduit, wherein the coil resonator comprises a first coil conduit adjacent a second coil conduit, wherein the second coil conduit extends within an interior channel of the first coil conduit, wherein a first fluid channel defined by the first coil conduit is operable to receive the first fluid, and wherein the second coil conduit defines a second fluid channel operable to receive a second fluid.

* * * * *